United States Patent [19]

Kitada et al.

[11] Patent Number: 4,769,093
[45] Date of Patent: Sep. 6, 1988

[54] MAGNETORESISTIVE DEVICE

[75] Inventors: Masahiro Kitada, Tokyo; Hideo Tanabe, Hachioji; Noboru Shimizu, Tokorozawa, all of Japan

[73] Assignee: Hitachi, Ltd., Tokyo, Japan

[21] Appl. No.: 63,773

[22] Filed: Jun. 24, 1987

Related U.S. Application Data

[63] Continuation of Ser. No. 803,641, Dec. 2, 1985, abandoned.

[30] Foreign Application Priority Data

Dec. 3, 1984 [JP] Japan ............... 59-254015

[51] Int. Cl.$^4$ ............... H01F 1/04
[52] U.S. Cl. ............... 148/310; 148/312; 420/94; 420/459; 365/158
[58] Field of Search ............... 420/459, 94; 148/310, 148/312

[56] References Cited

U.S. PATENT DOCUMENTS

| | | | |
|---|---|---|---|
| 3,117,896 | 1/1964 | Chu et al. | 148/31.55 |
| 3,582,408 | 6/1971 | Onyshkevych | 148/31.55 |
| 3,723,106 | 3/1973 | Schlenker et al. | 148/31.55 |
| 3,846,185 | 11/1974 | Nakajima et al. | 148/31.55 |
| 4,440,720 | 4/1984 | Masumoto et al. | 148/31.55 |
| 4,572,750 | 2/1986 | Masumoto et al. | 148/31.55 |

FOREIGN PATENT DOCUMENTS 3026498  2/1982  Fed. Rep. of Germany ... 148/31.55

OTHER PUBLICATIONS

Ahm et al., "Magnetic Thin-Film Alloy with Improved Thermal Stability", IBM Technical Disclosure Bulletin, vol. 8, No. 10, Mar. 1966.

Primary Examiner—John P. Sheehan
Attorney, Agent, or Firm—Antonelli, Terry & Wands

[57] ABSTRACT

A magnetoresistive device includes a magnetoresistive film made of permalloy alloy. This thin film is formed on a substrate by sputtering or vapor deposition method. Thereafter, the thin film is heated to a temperature between 200° C. and 350° C. by flowing an electric current therethrough or irradiating the thin film with an electron or laser beam. It is desirable that the heat treatment is effected in an alternating magnetic field. The permalloy alloy may contain at least one element including Rh, Ru, Mo, Cr and V.

9 Claims, 1 Drawing Sheet

MAGNETORESISTIVE DEVICE

This application is a continuation of application Ser. No. 803,641, filed Dec. 2, 1985 now abandoned.

BACKGROUND OF THE INVENTION

This invention relates to a magnetoresistive device and in particular to a magnetoresistive device using a magnetoresistive thin film.

In a conventional magnetoresistive film made of a permalloy alloy, its output voltage varies in the form of a cosine function with respect to a magnetic field applied, as disclosed in Ching Tsang: "Magnetics of small magnetoresistive sensor", J. Appl. Phys. 55(6), 1984, p. 2226. That is, the electric resistance $\rho$ of the permalloy film exhibiting such a change as indicated by a curve 1 in FIG. 1 can be represented by a relation of $\rho = \rho_0 + \Delta\rho \cdot \cos^2\theta$, where $\rho_0$ indicates the resistance of the permalloy film when there is no magnetic field, $\Delta\rho$ a variation in magnetoresistance, and $\theta$ an angle defined by the direction of a current flowing through the device and the direction of magnetization of the permalloy film. Thus, there is no substantially linear part in the magnetic field-output voltage characteristics curve. This remarkably influences the characteristics of a magnetic device in which a permalloy alloy film is used. For example, in the case where a conventional permalloy alloy film having such a non-linear magnetic field-current characteristic is used in a magnetoresistive type magnetic head, there takes place a problem that the range of the intensity of a bias magnetic field, which can be used, is restricted.

SUMMARY OF THE INVENTION

An object of this invention is to provide a magnetoresistive device which has a magnetoresistive film exhibiting a linear relationship between a magnetic field applied and its output voltage.

According to this invention, after a magnetoresistive thin film has been formed, the film is subjected to a heat treatment at temperatures between 200° C. and 350° C., whereby the magnetic field-output voltage characteristic curve for the magnetoresistive thin film is linearized.

The heat treatment can be effected either by flowing a predetermined amount of electric current therethrough or by irradiating with an electron or laser beam. It is preferable that the heat treatment is carried out under application of an alternating magnetic field.

DESCRIPTION OF THE PREFERRED EMBODIMENTS

Figure 1:
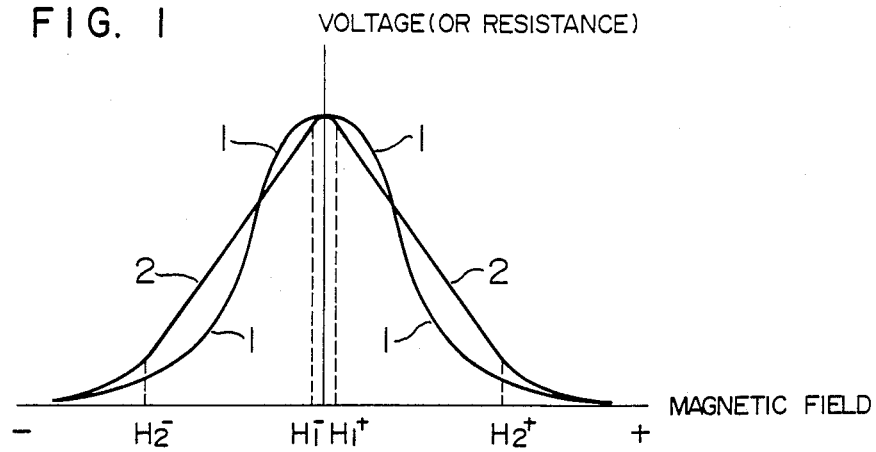
FIG. 1 shows magnetic field-voltage characteristics, where a curve 1 represents a characteristic of a conventional magnetoresistive film made of a permalloy alloy and a curve 2 a characteristic obtained according to this invention.

Embodiments of this invention will now be explained referring to the drawings.

Embodiment 1

A permalloy film having a composition of Ni - 21% Fe (magnetostrictivity: $+4 \times 10^{-6}$) is formed by vapor deposition or sputtering method to a thickness between 300 and 600 Å on a substrate made of glass, etc. Then, this permalloy film is shaped or patterned by photoetching into a desired form. Thereafter, electrodes made of Au, Al, etc. for flowing an electric current and for detecting variations in magnetoresistance are formed. Then, an electric current at a density of $3$–$4 \times 10^6$ A/cm$^2$ is flown through the resultant device for a period of time from 2–3 seconds to 1–2 minutes. By this flow of the electric current, the device is heated to a temperature from 200° C. to 350° C.

Figure 2:
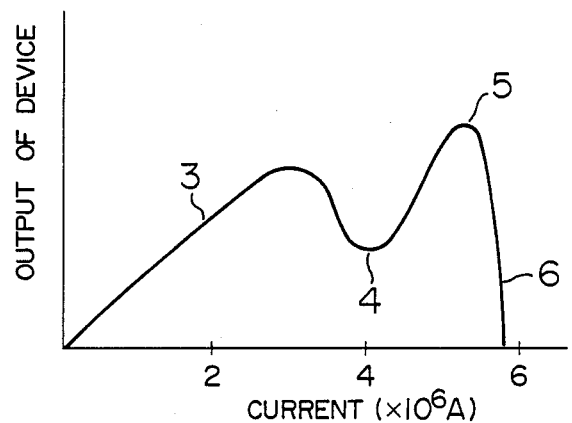
FIG. 2 is a diagram showing a current-output characteristic of a permalloy alloy thin film whose magnetostriction is positive.

Usually, the permalloy film has such an output voltage-current characteristic which changes as shown by the curve in FIG. 2. Namely, the output linearly changes, as shown by a curve portion 3, when a current flowing through the device is small. When the current exceeds $3$–$4 \times 10^6$ A/cm$^2$, the voltage decreases as indicated by a curve portion 4. When the current further increases, the voltage increases as indicated by a curve portion 5, and finally the permalloy film is destroyed as indicated by a curve portion 6.

When the current is kept at a value higher than that indicated by the curve portion 4 and then reduced to a current region indicated by the curve portion 3, the magnetic field-current characteristic of the magnetoresistive device including the permalloy thin film is changed from a characteristic represented by the curve 1 of FIG. 1 before the electric current is flown, to such a characteristic as represented by a curve 2. Though the characteristic indicated by the curve 1 changes in the form of a trigonometrical function, the characteristic indicated by the curve 2 has linear portions in ranges of magnetic field between $H_1{}^+$ and $H_2{}^+$ (e.g. 2 and 30 Oe) and between $H_1{}^-$–$H_2{}^-$ (e.g. $-2$ and $-30$ Oe). For a magnetoresistive magnetic head, a suitable bias magnetic field is applied thereto in order to use a region where the magnetic field-voltage characteristic is well linear. In such a state, an alternating magnetic field from a magnetic medium, etc. is detected. However, the conventional characteristic as shown by the curve 1 of FIG. 1 has only a very small portion where the linearity is sufficiently good. Therefore, the output waveform will be distorted unless the bias magnetic field is adjusted to a proper value within a restricted range. On the other hand, according to this invention, since the regions where the magnetic field-voltage characteristic is linear are very wide, it can be used in wide ranges of bias magnetic field intensity and no distortions in output waveform are produced even if the intensity of signal or magnetic field is great.

According to this invention, a permalloy alloy film is heated to a temperature between 200° C. and 300° C. This is because at temperatures under 200° C. no diffusion or reconfiguration of atoms is provoked in the alloy film. That is, according to this invention, it is supposed that diffusion or reconfiguration of atoms is produced by heating in the alloy film and, as a result, its characteristic is changed. On the other hand, at temperatures above 350° C., a film formed by sputtering or vapor deposition method is recrystalized.

Embodiment 2

Figure 3:
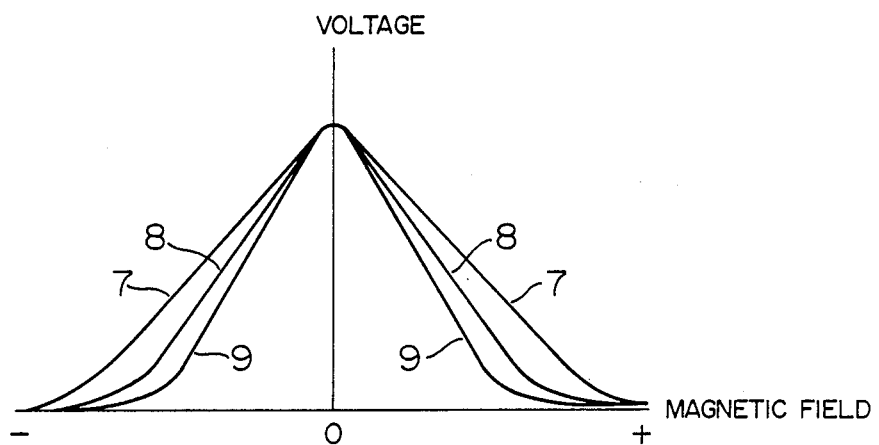
FIG. 3 is a diagram showing magnetic field-voltage characteristics in the case where this invention is applied to permalloy alloy films whose magnetostriction is positive.

The treatment method by electric current according to this invention is remarkable when the magnetostriction of a permalloy magnetic film used is positive. Further, the magnetic field-voltage characteristic after the treatment by electric current varies depending on the composition of the permalloy. Characteristic curves 7, 8 and 9 in FIG. 3 indicate magnetic field-voltage characteristics obtained by treating three kinds of permalloy alloy films, whose magnetostrictions are positive, in the same manner as that for Embodiment 1. The curve 7 corresponds to Ni - 20% Fe with magnetostrictivity of $+2 \times 10^6$, the curve 8 to Ni—21% Fe with magnetostrictivity of $+4 \times 10^{-6}$, and the curve 9 to Ni - 23% Fe with magnetostrictivity of $+6 \times 10^{-6}$. As shown in FIG. 3, the gradient of the characteristic curve varies depending on the magnetostriction or the composition of the permalloy. Therefore, the kind of permalloy can be selected in accordance with the purpose of utilization of a magnetoresistive head. When the magnetostriction is smaller than $1 \times 10^{-7}$, the effect of the treatment by electric current is not remarkable. When the magnetostriction is greater than $15 \times 10^{-6}$, this method cannot be applied because the decrease of the magnetoresistive output is considerable. Accordingly, the method according to this invention is effective when the magnetostriction is between $1 \times 10^{-7}$ and $15 \times 10^{-6}$.

Embodiment 3

For various thin films each including a permalloy alloy to which at least one element including Rh, Ru, Mo, Cr, V, etc. is added up to about 5% and whose magnetostriction is between $1 \times 10^{-7}$ and $15 \times 10^{-6}$, the same effects as those obtained in Embodiments 1 and 2 can be obtained by treating them in the same way as Embodiment 1. These elements are effective for increasing the anti-corrosive property of the permalloy.

Embodiment 4

Permalloy thin film devices prepared in the same manner as Embodiments 1 to 3 can provide the effect of this invention illustrated in FIGS. 1 and 3 even when the permalloy thin films are heated for a short period of time in a manner other than the heating by electric current. For exampled the characteristics shown in FIGS. 1 and 3 can be obtained by heating a thin film of Ni - 21% Fe alloy for 2-3 seconds, e.g. by irradiating it with an electron beam or a laser beam in a vacuum atmosphere. Further, the same characteristics can be obtained by heating the film during a short period of time in a usual vacuum furnace. When an electric current of $10^5$–$10^6$ A/cm$^2$ is flown therethrough during the above heat treatments, remarkable effects can be obtained.

The present inventors have further confirmed that between results are obtained when an alternating magnetic field is applied during the above-described heat treatment by electric current, by irradiation with an electron beam, by irradiation with a laser beam, or in a vacuum furnace. For example, a thin film of Ni - 21% Fe alloy is heated for 2-3 seconds by irradiating it with an electron beam in a vacuum atmosphere under application of an alternating magnetic field which has an intensity of 100 Oe and a frequency of 50 Hz.

As described above, according to this invention, it is possible to linearize the magnetic field-voltage characteristic of a magnetoresistive device and therefore this invention is effective for improving the symmetricity of output waveform of the magnetoresistive device and for reducing its distortion.

We claim:

1. A magnetoresistive device, in which a permalloy alloy thin film which has been shaped into a predetermined form from a layer of permalloy alloy and thereafter subjected to a heat treatment at a temperature between 200° C. and 350° C. to provide a linear relationship between a magnetic field applied to the film and an output voltage of the film is used as a magnetoresistive film; said permalloy alloy thin film having a linearized magnetic field-output voltage characteristic and a magnetostriction between $1 \times 10^{-7}$ and $15 \times 10^{-6}$.

2. A magnetoresistive device according to claim 1, wherein said heat treatment is effected by flowing an electric current through said thin film.

3. A magnetoresistive device according to claim 1, wherein said heat treatment is effected by irradiating the thin film with an electron beam.

4. A magnetoresistive device according to claim 1, wherein said heat treatment is effected by irradiating the thin film with a laser beam.

5. A magnetoresistive device according to claim 1, wherein said permalloy alloy thin film contains at least one element selected from the group consisting of Rh, Ru, Mo, Cr and V.

6. A magnetoresistive device according to claim 1, wherein said heat treatment is effected in an alternating magnetic field.

7. A magnetoresistive device according to claim 2, wherein said heat treatment is effected in an alternating magnetic field.

8. A magnetoresistive device according to claim 3, wherein said heat treatment is effected in an alternating magnetic field.

9. A magnetoresistive device according to claim 4, wherein said heat treatment is effected in an alternating magnetic field.

* * * * *